(12) United States Patent
Deslandes

(10) Patent No.: US 10,514,418 B2
(45) Date of Patent: Dec. 24, 2019

(54) OPTIMIZED WAVELENGTH PHOTON EMISSION MICROSCOPE FOR VLSI DEVICES

(71) Applicant: FEI Company, Hillsboro, OR (US)

(72) Inventor: Herve Deslandes, Sunnyvale, CA (US)

(73) Assignee: FEI Company, Hillsboro, OR (US)

( * ) Notice: Subject to any disclaimer, the term of this patent is extended or adjusted under 35 U.S.C. 154(b) by 314 days.

(21) Appl. No.: 15/286,371

(22) Filed: Oct. 5, 2016

(65) Prior Publication Data

US 2017/0052223 A1 Feb. 23, 2017

Related U.S. Application Data

(63) Continuation-in-part of application No. 14/250,361, filed on Apr. 10, 2014, now Pat. No. 9,817,060.

(60) Provisional application No. 62/237,399, filed on Oct. 5, 2015, provisional application No. 61/810,645, filed on Apr. 10, 2013.

(51) Int. Cl.
*G01R 31/26* (2014.01)
*G01R 31/311* (2006.01)

(52) U.S. Cl.
CPC .................. *G01R 31/311* (2013.01)

(58) Field of Classification Search
CPC .............. G01R 31/2813; G01R 15/246; G01R 31/311; G01R 31/28; G01R 15/24
See application file for complete search history.

(56) References Cited

U.S. PATENT DOCUMENTS

| 4,755,874 | A | * | 7/1988 | Esrig ................. G01N 21/95607 348/126 |
| 5,166,755 | A | | 11/1992 | Gat |
| 5,822,222 | A | | 10/1998 | Kaplinsky et al. |
| 6,825,978 | B2 | | 11/2004 | Khurana et al. |

(Continued)

FOREIGN PATENT DOCUMENTS

| JP | H05-191728 | 7/1993 |
| JP | H05-226220 | 9/1993 |

(Continued)

OTHER PUBLICATIONS

Deslandes, H. et al., "Limitations to photon-emission microscopy when applied to hot devices", Proc. ESREF 2003, Mic. Rel. 43, 2003, pp. 1645-1650.

(Continued)

*Primary Examiner* — Melissa J Koval
*Assistant Examiner* — Courtney G McDonnough
(74) *Attorney, Agent, or Firm* — Klarquist Sparkman, LLP

(57) ABSTRACT

A method for emission testing of a semiconductor device (DUT), by mounting the DUT onto an test bench of an emission tester, the emission tester having an optical detector; electrically connecting the DUT to an electrical tester; applying electrical test signals to the DUT while keeping test parameters constant; inserting an optical filters into an optical path of the emission tester and collecting emission test signal from the optical detector; removing the filter from the optical path and collecting emission test signal from the optical detector. Comparing the images obtained with and without the filter. The filter may be shortpass to obtain emission signal, a bandpass for detecting forward bias, or longpass to obtain thermal signal.

23 Claims, 3 Drawing Sheets

(56) References Cited

U.S. PATENT DOCUMENTS

| | | | |
|---|---|---|---|
| 7,157,706 | B2 | 1/2007 | Gat et al. |
| 7,427,758 | B2 | 9/2008 | Garman et al. |
| 7,466,343 | B2 | 12/2008 | Gat |
| 7,659,981 | B2 | 2/2010 | Lo et al. |
| 7,816,650 | B2 | 10/2010 | Garman et al. |
| 8,071,947 | B2 | 12/2011 | Garman et al. |
| 8,164,813 | B1 | 4/2012 | Gat |
| 8,466,964 | B2 | 6/2013 | Gat et al. |
| 8,497,479 | B1 | 7/2013 | Garman et al. |
| 2003/0218800 | A1* | 11/2003 | Khurana ............ G02B 21/0004 359/368 |
| 2006/0103378 | A1* | 5/2006 | Pakdaman ........... G01R 31/311 324/228 |
| 2008/0170143 | A1 | 7/2008 | Yoshida |
| 2010/0025588 | A1* | 2/2010 | Trupke ............... G01N 21/6489 250/362 |

FOREIGN PATENT DOCUMENTS

| | | |
|---|---|---|
| JP | H08-274138 | 10/1996 |
| JP | 2005-140868 | 6/2005 |
| JP | 2005-523428 | 8/2005 |
| WO | WO 2014/169154 | 10/2014 |

OTHER PUBLICATIONS

Faggion, G. et al., "Effect of IC Geometry Shrink on Photon Emission Spectrum", LSI Testing Symposium, 2007, Japan, pp. 335-340.

Gat, N. et al., "Variable Cold Stop for Matching IR Cameras to Multiple f-number Optics", Society of Photo-Optical Instrumentation Engineers, SPIE Proceedings 6542, Infrared Technology and Applications, XXXIII, Defense & Security Symposium, Orlando, FL, 2007, pp. 1-10.

Kindereit, U., et al., "Near-Infrared Photon Emission Spectroscopy Trends in Scaled SOI Technologies", ISTFA 2012: Conference Proceedings from the 38th International Symposium for Testing and Failure Analysis, Nov. 11-15, 2012, Phoenix Convention Center, Phoenix, Arizona, USA, ASM International, 2012, p. 128 (7 pages).

Kindereit, U. et al., "Near-infrared photon emission spectroscopy of a 45 nm SOI ring oscillator", IRPS 2012: Reliability Physics Symposium, Apr. 15-19, 2012, Anaheim, California, USA, p. 2D.2.1-2D.2.7, 2012 IEEE International, 7 pages.

International Search Report and Written Opinion in International Patent Application No. PCT/US2014/033701, dated Aug. 22, 2014.

Opto-Knowledge Systems, Inc. (OSKI) VariAp Product Page, at http://www.techexpo.com/WVVW/opto-knowledge/prod_variAp.html, accessed Apr. 13, 2015.

VariAp Systems by OSKI, Opto-Knowledge "Converting Light Into Knowledge Since 1991": Informational Brochure, 8 pages, accessed Apr. 13, 2015.

US Army SBIR Commercialization brochure, at http://www.techexpo.com/WVVW/opto-knowledge/Commercialization_Army_book2005-a.pdf, accessed Apr. 13, 2015.

US Army SBIR Quality award, at http://www.techexpo.com/WVVW/opto-knowledge/2006-Army-SBIR_Quality_Award-1.pdf, accessed Apr. 13, 2015.

Notice of Reasons of Refusal for related Japanese Application No. JP2016-507666, dated Dec. 19, 2017, 8 pages.

\* cited by examiner

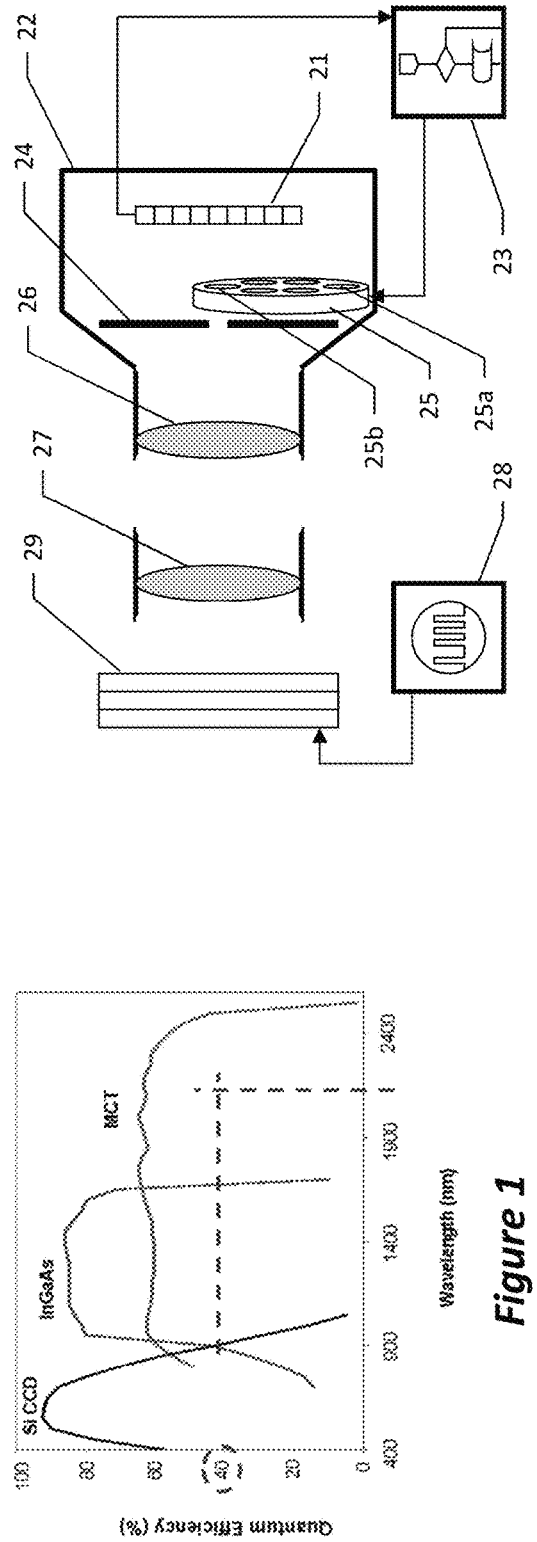
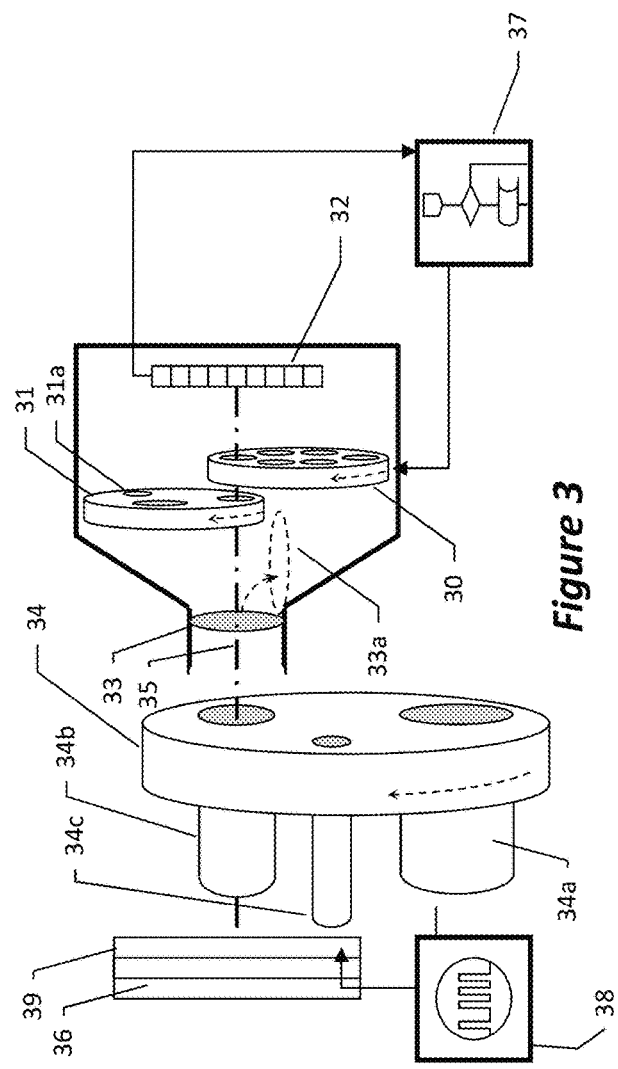
Figure 1
Figure 2
Figure 3

OPTIMIZED WAVELENGTH PHOTON EMISSION MICROSCOPE FOR VLSI DEVICES

RELATED APPLICATIONS

The present application claims priority benefit from U.S. Provisional Application No. 62/237,399, filed on Oct. 5, 2015. The present application is also a continuation-in-part of U.S. patent application Ser. No. 14/250,361, filed Apr. 10, 2014, which claims priority benefit from U.S. Provisional Application No. 61/810,645, filed on Apr. 10, 2013, the disclosures of all of which are incorporated herein in their entireties.

GOVERNMENT LICENSE RIGHTS

This invention is based upon work supported by the Office of the Director of National Intelligence (ODNI), Intelligence Advanced Research Projects Activity (IARPA), via Air Force Research Laboratory (AFRL) contract number FA8650-11-C-7105. The ideas and conclusions contained herein are those of the inventors and should not be interpreted as necessarily having the official endorsements, either expressed or implied, of ODNI, IARPA, AFRL, or the U.S. Government.

FIELD

The present application belongs to the field of Photon Emission microscopy.

BACKGROUND

Backside Photon Emission Microscopy (PEM) is commonly used for circuit diagnostics and analyses of VLSI (Very-Large-Scale Integration) devices (chips). The premise of PEM is that individual logic gates within a VLSI circuit emit "Hot Carrier" (HC) photons when switching states. These photons are generally in the Infrared (IR) part of the spectrum, and since Silicon is transparent at these wavelengths, it is possible to observe the circuit (Device Under Test, or DUT) in action through its back side (the substrate side, opposite to the metal layer side).

Electron-hole recombination is a mechanism that dominates in forward-biased p-n junctions; this can arise in bipolar or BiCMOS circuits, latched-up CMOS, some types of gate or power-supply shorts, and some poly stringer conditions, to name a few. The emission is relatively narrow spectrally, and is centered near 1150 nm. Forward-biased p-n diodes emit this light even in the absence of a strong electric field. The emission comes from bipolar recombination, not from hot carriers. Thus this signal occurs at low voltage. In general, it is not possible to have a p-n junction forward-biased with more than 1-2 V due to the extremely high current densities that would be obtained. So the case of high voltage is not particularly important; although, if high forward bias voltages could be achieved, the spectrum would be nearly identical to the low-voltage case.

Cameras (detector arrays) sensitive across the IR range are readily available, with frequency response shown in FIG. 1. Commonly, MCT cameras (Mercury Cadmium Telluride, HgCdTe) are used for this purpose since their response is uniform across a wide slice of the spectrum extending up to LWIR (about 18 um). Other types of detectors such as MOS CCD, Indium Antimonide (InSb) or Indium-Gallium-Arsenide (InGaAs) are also commonly used.

The spectral characteristic of the emissions from the semiconductor gates depends on many factors, such as excitation voltage, defect type and fabrication technology. A significant part of the emission lies in wavelengths beyond the traditional threshold of 1.55 um (commonly observed by InGaAs cameras operating at liquid Nitrogen temperature).

For common VLSI devices, however, the HC emissions are very faint, and since the amount of noise originating in thermal emissions (which follows the black body radiation spectral distribution) increases with wavelength, it interferes more with observations at these longer wavelengths.

In each band of the spectrum, therefore, are present both HC emissions from the DUT, which constitute the signal, and thermally-originated emissions, from both the DUT and the optics of the microscope, which contribute to the noise. Having a large signal-to-noise ratio (SNR) is important for achieving good observations.

The faint HC emissions also cause the exposure times to be as long as hundreds of seconds, which complicates the observation. One way to shorten such exposure times is to increase the SNR.

Some existing designs limit the range of observation to 1.5 um (which coincides with the sensitivity of InGaAs cameras) and since thermal noise is rather weak at these wavelengths, such a system works great for devices operating voltage above 800 mV.

For such wavelengths, passive designs are used to mitigate thermal noise that originates outside of the nominal optical path of the microscope, but they cannot completely eliminate it, nor can they eliminate thermal noise that originates within the optical path. In prior art systems, a relay lens is placed between the objective and the detector, and a cold aperture is placed between the relay lens and the detector in a position corresponding to the image location of the aperture of the objective, as imaged by the relay lens. This arrangement minimizes stray thermal radiation that is emitted by the body of the camera. For further information the reader is referred to, e.g., U.S. Pat. No. 6,825,978,

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed aspects enable using the spectral intensity of the emission of IC transistors in the field of view to identify transistors that are not working properly either due to process, design or operational issues.

Described herein are methods for testing an integrated circuit DUT. The method may include the steps comprising: placing the DUT on a bench having an optical arrangement defining optical path; inserting at least one optical filter with high blocking capabilities beyond the cut-off wavelength into the optical path; imaging photon emission from the DUT through one or more shortpass filters; imaging photon emission from the DUT without filters; and comparing the imaging with and without filter so as to identify a specific failure type. The selected filter is configured as either a shortpass filter cutting off transmission above a set wavelength, or a bandpass filter passing light centered about 1150 nm with a bandwidth of 300 nm. When the filter is a shortpass filter, the optical sensor is configured as a longpass filter, cutting off transmission below 900 nm.

A method is disclosed for emission testing of a semiconductor device (DUT), comprising the steps of: mounting the DUT onto an test bench of an emission tester, the emission tester having an optical detector; electrically connecting the DUT to an electrical tester; applying electrical test signals to the DUT while keeping test parameters constant; inserting a shortpass filter into an optical path of the emission tester and collecting emission test signal from the optical detector; removing the shortpass filter from the optical path of the emission tester and collecting emission test signal from the optical detector; and comparing the emission test signals obtained with and without the shortpass filter to identify faulty circuit elements in the DUT.

A further method is disclosed for emission testing of a semiconductor device (DUT), comprising the steps of: mounting the DUT onto an test bench of an emission tester, the emission tester having an optical detector; electrically connecting the DUT to an electrical tester; applying electrical test signals to the DUT while keeping test parameters constant; inserting a shortpass filter into an optical path of the emission tester and collecting emission test signal from the optical detector; removing the shortpass filter from the optical path of the emission tester and inserting a thermal filter into the optical path; collecting thermal image signal from the optical detector; and comparing the emission test signals obtained with the shortpass filter to the thermal image obtained with the thermal filter to identify faulty circuit elements in the DUT. The shortpass filter is configured for passing light below 2000 nm, while the thermal filter is configured to block light having wavelength below 2000 nm. The shortpass filter may be a filter suppressing transmission of light having wavelength above about 1850 nm.

Also described herein are aspects of a camera which adaptively selects an optimal wavelength for observation of a VLSI device, by inserting an appropriate filter in the optical path. The wavelength is optimized according to criteria such as maximizing the SNR, or a combination of high SNR and high resolution (which biases the optimization towards shorter wavelengths). The cameras may also have multiple swappable objective lenses and multiple cold apertures, and the position and size of the cold aperture has to be adjusted according to each objective lens. This can be achieved by having multiple apertures on a selector wheel.

While previous art already describes the introduction of a filter in the optical path, it does not do so in an adaptive manner and with consideration to maximizing SNR. Since the optical signal from the VLSI device is very faint, such filters traditionally have a wide bandwidth, in order to allow more light in, and thus shorten the required exposure times.

According to disclosed aspects, a set of short pass filters is used, and different shortpass filter is selected according to the type of device being investigated and the voltage applied to the device (A shortpass (SP) filter is an optical interference or colored glass filter that attenuates longer wavelengths and transmits (passes) shorter wavelengths over the active range of the target spectrum). In order to do that, however, the system first needs to characterize the SNR across the possible observation spectrum. The disclosed embodiments enable investigation of recent VLSI technology of devices that exhibit HC emissions in longer wavelengths, with a useful signal as high as 3 um.

Since the HC photon emissions depend both on inherent characteristics of the DUT and on operating parameters such as voltage and temperatures, the optimal filter selection vary from device to device, and so it may not be practical to pre-determine it.

According to another embodiment, a method for emission testing of a semiconductor device (DUT) is provided, comprising the steps of: mounting the DUT onto an test bench of an emission tester, the emission tester having an optical detector; electrically connecting the DUT to an electrical tester; applying electrical test signals to the DUT while keeping test parameters constant; serially inserting one of a plurality of shortpass filters into an optical path of the emission tester and collecting emission test signal from the optical detector until all available shortpass filters have been inserted into the optical path; determining appropriate shortpass filter providing highest signal to noise ratio of the emission signal; inserting the appropriate shortpass filter into the optical path; and, performing emission testing on the DUT. The method may further include changing voltage Vdd and selecting a different shortpass filter and thereafter performing a second emission testing of the DUT.

According to further embodiment, a method for emission testing of a semiconductor device (DUT) is provided, comprising: providing an electrical tester capable of inducing state changes in gates of said DUT; providing an emission tester having an optical system to image emissions from the DUT onto a photodetector; providing a plurality of shortpass filters serially insertable into optical path of the optical system; stimulating the DUT using said electrical tester; serially collecting optical emissions from said DUT through each of the filters, while keeping all test parameters constant; measuring signal to noise ratio (SNR) of the optical emission collected through each filter; selecting one filter that maximizes the SNR; stimulating said DUT using the electrical tester; and collecting optical emissions from said DUT through the one filter.

DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a response function of various camera sensor technologies.

FIG. 2 is a camera with multiple filters and adaptive controller, according to described embodiments.

FIG. 3 is a camera with multiple objectives, multiple short-pass filters, and multiple cold apertures, and removable relay lens, according to described embodiments.

DETAILED DESCRIPTION

Figure 6:
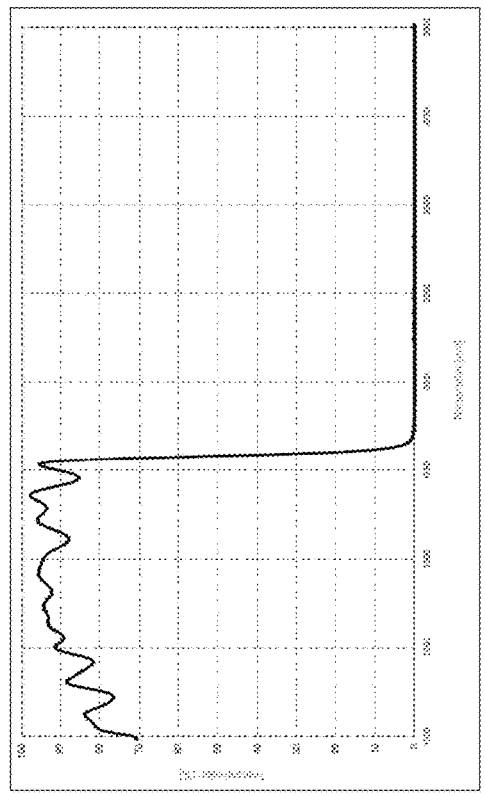
FIG. 6 is a plot showing transmission of an SP1800 shortpass filter.

Described herein are methods for testing semiconductor chips (IC) for various faults. The testing is done while applying test signal to the IC and performing different types of imaging of the IC during the testing. The different images obtained are compared to identify faults. The methods employ the ability to insert and remove various filters in the optical path of the imaging system. It has been discovered by the inventor that certain faults can be identified by comparing images taken with and without the filters. It has also been discovered by the inventor that certain faults can be identified by comparing optical emission images with thermal images.

According to one example, test signals are applied to the IC, such that switching transistors emit photons. An emission filter, e.g., a band filter, that passes light with wavelength below 2000 nm or below 1600 nm (if the signal is strong enough), is used to obtain an emission image. This image will basically consist of "dots" of light—each indicating a switching transistor. Then the emission filter is removed and a thermal filter is inserted. The thermal filter may be a filter suppressing transmission of light having wavelength below about 1850 nm or 2000 nm. Then a thermal image is obtained. The thermal image will basically consist of "dots" of light of the switching transistors, but also dots of light indicating overheating locations, e.g., an overheating contact or line. Thus, when the emission and thermal images are compared, the "extra" dots on the thermal images that do not appear in the emission images indicate overheating locations. In other embodiments, rather than using a bandpass filter, a shortpass filter is used, which cuts off transmission of wavelengths of above 1850 nm or above 2000 nm.

According to another example, test signals are applied to the IC to bias the device. By default the device should not become forward bias. If any device in the DUT becomes forward bias, it means that there is a fault in the DUT. To detect this fault, a first emission image is obtained without having any filter in the optical path. This image is relatively noisy and will include device emissions at any frequency. Then a forward bias filter, e.g., a bandpass filter that passes light with wavelength centered at about 1150 nm, with a bandwidth of 300 nm, is used to obtain a filtered emission image. This image is less noisy than the unfiltered image and should basically consist only of "dots" of light indicating a forward bias device. Thus, when the filtered image shows a drop in the light intensity, it indicates a device that is not forward biased, i.e., is in the typical working condition. In some embodiments, a shortpass filter is used instead, cutting off transmission of wavelengths of above 1300 nm.

The disclosed embodiments further describe aspects of a camera which adaptively selects an optimal wavelength for observation of a VLSI device, by inserting an appropriate short pass filter in the optical path. The wavelength is optimized according to criteria such as maximizing the SNR, or a combination of high SNR and high resolution (which biases the optimization towards shorter wavelengths), so as to obtain the best emission image for a given device under test (DUT).

While previous art already describes the introduction of a wide-band filter in the optical path, it does not do so in an adaptive manner and with consideration to maximizing SNR. Since the optical signal from the VLSI device is very faint, such filters traditionally have a wide bandwidth, in order to allow more light in, and thus shorten the required exposure times.

Conversely, disclosed embodiments use a shortpass filter, since even though the total amount of light passing the filter is smaller, the high SNR still gives shorter exposure times as it matches the specific emission wavelength of the DUT and the applied voltage. In some embodiments, the system first needs to characterize the SNR across the possible observation spectrum.

Since the HC photon emissions depend both on inherent characteristics of the DUT and on operating parameters such as voltage and temperatures, the optimal filter selection can vary from device to device, and so it may not be practical to pre-determine it.

Described herein are aspects of a microscope which adaptively selects an optimal bandwidth for observation of a VLSI device, by inserting an appropriate filter in the optical path. The method includes steps to determine the best shortpass filter so as to obtain the best emission image from each specific DUT at each specific applied voltage, e.g., Vdd.

Aspects of the invention incorporate a method for emission microscopy of a DUT, utilizing an emission microscope having the camera whose embodiment is described in FIG. 2. The camera includes an electronic detector array [21] located within a thermal enclosure [22] and connected to a controller [23]. Also within the thermal enclosure is a cold aperture [24], a filter selector wheel [25] with several short pass filters [25a, 25b . . . ]. The rest of the optical path includes a relay lens [26] and an objective lens [27]. The controller is also connected to the filter selector wheel [25]. A tester [28], e.g., an Automated Testing Equipment (ATE), is used to supply the DUT [29] with a stimulation signal to induce it to operate and change state. The ATE stimulation signal includes a signal at a given voltage Vdd. Different voltages cause the emission to have different wavelengths, so the filter wheel is used to select the best short pass filter according to the emission.

The camera in this embodiment uses an MCT (Mercury Cadmium Telluride, HgCdTe) detector array since it has a favorable (uniform and wide) response across the short and medium IR spectrum, but other types of detectors (e.g. InGaAs, extended InGaAs or InSb) can also be used. In some embodiments, the detector is used as a longpass filter, by cutting off any transmission of wavelength below about 900 nm. Thus, by including a shortpass filter cutting off transmission at wavelength such as 1300 nm, the system in effect becomes a bandpass filter of wavelength between 900 nm to 1300 nm, such that it is centered at around 1150 nm.

In the aspects of the invention described herein, when operating, the controller operates in one of two modes.

"Characterization" or calibration mode: In this mode the controller uses the tester to create a test signal which creates a robust emission from the DUT. The controller then aggregates multiple measurements from the detector array (enough to form a statistical base measurement), comparing the times when the DUT is both active and inactive, to find the noise floor level of the system. In finding this level, the controller can aggregate and compare measurements from multiple pixels. The controller repeats this process while using different short pass filters, and so can tabulate the SNR for each filter and select the optimal filter.

"Observation" or test mode: In this mode the controller switches to the optimal filter, and uses the tester to run the real-life test vectors to observe the DUT.

In some embodiments, the objective lens [27] has a flat front surface and its index of refraction matches that of the substrate of the DUT, so that it can be used in contact with the DUT, increasing the numerical aperture of the camera. A lens like this is called a solid immersion lens (SIL), and it can operate together with a standard collection objective lens.

In some embodiments, the camera features several interchangeable objective lenses, typically mounted on a rotary turret. One of the objective lenses can be a Macro lens, which by its nature is larger in diameter and requires a larger relay lens. In such a situation, it becomes advantageous to not use the relay lens configuration while using the macro lens, and to install the relay lens on a mount that allows it to be removed from the optical path.

FIG. 3 depicts an embodiment of this invention. The detector [32] and short pass filter selector [30] are unchanged from the previous embodiment. A turret [34] carries multiple objective lenses [34a, 34b, 34c]. One of the lenses [34a] is a macro lens and is larger than the other lenses which are micro lenses. The relay lens [33] is mounted on a pivot or slide which allows it to be moved to a position [33a] outside the optical path, which is done when the macro lens [34a] is in use. An aperture wheel [31] contains several cold apertures [31a] of different sizes, each matching one of the objective lenses. The optical axis [35] is indicated by the horizontal dashed line. Rotating the filter selector [30] and aperture wheel [31] to different position provides multiple combinations of filters and apertures. In one embodiment, all of these combinations are provided in a single wheel, such as the wheel [25] illustrated in FIG. 2. That is, in such a case, wheel [25] has a number of positions that equals the number of positions of wheel [30] times the number of positions of wheel [31]. Consequently, each position [25a, 25b . . . ] is a combination of a filter and cold aperture, such that the aperture [24] is eliminated.

The DUT 39 (or a die on a wafer) is mounted onto a bench 36. The bench 36 may include temperature control mechanism to maintain the DUT at constant temperature during testing. Such mechanism may include, for example, thermoelectric cooler (TEC), spray cooler, etc. The DUT receives test signals (vectors), including voltage Vdd, from a tester 38 (e.g., ATE). Tester ATE may be a standard testing equipment and is not part of the emission detection system. Controller 37 is configured to control the operation of the emission tester. Controller 37 may be programmed to operate the short pass filter selector 30 and the collection of emission signal from the optical detector 32.

Figure 4:
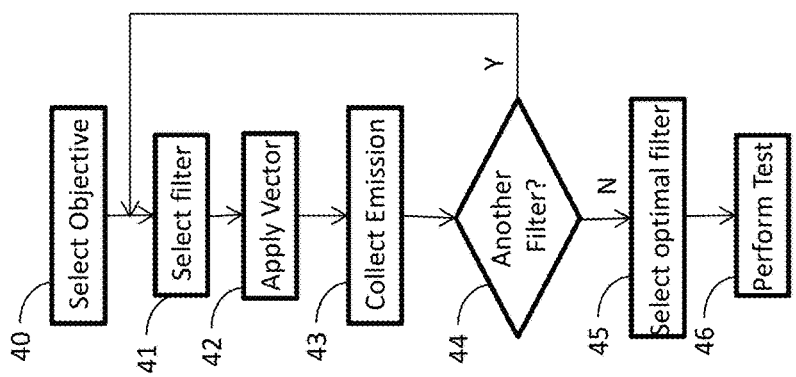
FIG. 4 illustrates a flow chart of a process according to one embodiment.

FIG. 4 illustrates a flow chart of a process according to one embodiment. In step 40, an objective lens is selected from the available objective lenses. In one embodiment, this step includes the landing of a SIL on the DUT to collect emission form the area of interest. Also, in some embodiments this step includes the selection of corresponding cold filter. In step 41 a first filter, among a plurality of short pass filters, is selected. In one embodiment, each short pass filter has a cut-off frequency at different wavelength, enabling coverage in the wavelengths from about 1200 nm to about 2200 nm. Each short pass filter has an upper cut-off wavelength that practically eliminates any transmission above its cut off, thus avoiding noise above the selected cut off frequency, but admitting light having wavelength below the indicated cut-off wavelength. In an alternative embodiment, the short pass filters may be replaced by narrow-band filters, wherein each narrow-band filter has a bandwidth of about 100 nm, and the available filters are distributed to cover frequencies in the wavelengths from about 1200 nm to about 2200 nm. However, shortpass filters enable more signals to pass than bandpass filters, so it is preferable to use short pass filters. Also, since the thermal background emission and its associated noise are both increasing with wavelength, using short pass filters instead of bandpass filters efficiently cuts off these deleterious effects, while enabling higher signal levels to pass at wavelengths lower than the cut off.

According to one embodiment, four short pass filters are used. In one example the short pass filters used are SP1550 (which is used to mimic an InGaAs camera—i.e., cuts off longer wavelengths that a standard InGaAs sensor cannot detect, but any of the other detectors, such as HgCdTe or extended InGaAs can detect), SP1800, SP1900, and SP2000. Each short pass filter transmits light having wavelength below the specified cut off, but blocks transmission of light having wavelength above the specified cut off. For example, SP1800 transmits everything below, but blocks everything above 1800 nm, as shown in FIG. 6. Since the detector itself only absorbs light above 900 nm, the system is effectively capturing light from 900 nm to 1800 nm in the example of SP1800.

Figure 5:
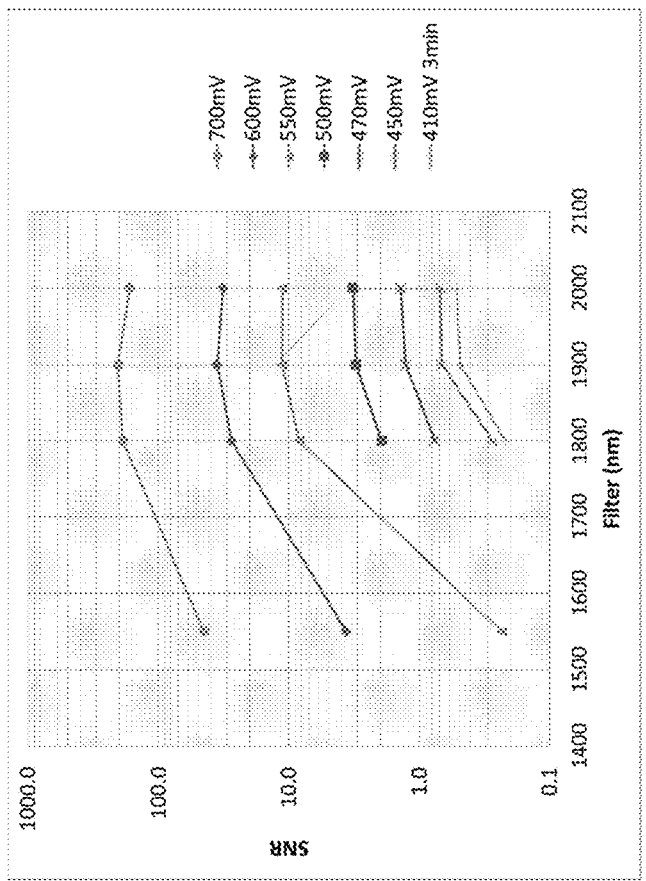
FIG. 5 illustrates an example of a plot of signal to noise ratio against wavelength according to one embodiment.

In step 42, a test vector is applied to the DUT, while holding all parameters constant. Importantly, the temperature of the DUT and the voltage Vdd should be held constant, while at step 43 emission signal is collected and stored. Then, in step 44 it is determined whether there are more filters to test and, if so, the process reverts to step 41 wherein the next filter is selected. Then, the same test vectors are applied to the DUT and, while keeping all parameters constant, another set of emission signal is collected and stored. When at step 44 it is determined that all filters have been tested, the process proceeds to step 45 to determine the best filter to use for the actual emission testing of the DUT. According to one embodiment, in this step the detected emission and noise are quantified against each of the filters used. In one specific embodiment this is done by plotting signal to noise ratio against wavelength. An example of such a plot is depicted in FIG. 5. In the example of FIG. 5, the test outlined above was repeated for all available filters and for different Vdd (each series of test having Vdd held constant). The broken line indicates the optimum filter for best SNR shifts to longer wavelengths when Vdd drops. Then, for the actual emission test, it is determined what filter to use according to the best SNR and the voltage Vdd that is going to be used in the emission test. In the example of FIG. 5, it is shown that for a lower Vdd a longer wavelength filter may be used, while a shorter wavelength filter may be used for the higher Vdd. On the other hand, other testing with different devices have shown that such behavior is not typical, and when testing devices which operate at the mV range, i.e., below 1 volt, the behavior is reversed, i.e., lower Vdd produces emission at longer wavelengths, thus requiring a longer wavelength filter for best SNR. Therefore, this test should be performed for each new device tested. The standard emission test is then performed at step 46 using the appropriately selected shortpass filter.

According to disclosed embodiments, experiments were run where a Device Under Test was stimulated under two different electrical test conditions. The objective was to find out if one of the conditions is forcing the transistor to run in forward bias mode. In this embodiment, bandpass filter was added in the optical path, wherein the filter passes light centered about 1150 nm, with a bandwidth of 300 nm, or with a shortpass filter passing light having wavelength below 1150 nm, 1200 nm or 1550 nm. Larger bandwidth would begin to bring in extraneous signal and thus decrease resolution and narrower bandwidth would decrease sensitivity. For best results, the filter is liquid nitrogen cooled.

According to one embodiment the system was used to identify faulty elements within the DUT. Specifically, a testing method was developed to identify elements in a forward bias state, due to electron hole recombination. The DUT was biased in a controlled test condition, and the testing procedure was developed to identify transistors assuming forward bias due to the applied bias condition. The forward bias would indicate a fault. Two images were then captured: one with a bandpass filter centered around 1150 nm in the optical path and a second with the filter removed. The results indicate that the emission intensity of a given block is the same with (12505 counts) or without (15388 counts) the filter in the optical path. The slight reduction in intensity is simply a function of the transmissivity of the filter. Since the intensity inside the block is the same with or without the filter, it is concluded that the filter has no effect on this type of emission. All the emission is inside the filter. Since the filter is a bandpass filter around 1150 nm, we can then conclude that transistors inside that block are in forward bias mode, since transistors in forward bias mode emit at about 1150 nm wavelength.

The test was then repeated using different test conditions. Again two images were captured: one with the filter in the optical path and one with the filter removed. Under these different test conditions, the intensity of the same block dropped significantly when the filter is in the optical path. This means that most of the emission is outside the spectral range of the filter, i.e., not in the wavelength of light generated by forward bias. Thus, the transistors in that block are considered not to be in forward bias mode and are likely driven by hot carrier emission.

From the above process we can conclude that the first test condition is forcing the transistors to work in forward bias mode which is abnormal. That is, there is a design, process or test program issue. This process demonstrates that by comparing two images, with and without the bandpass filter, one can isolate forward bias elements within the DUT. As noted above, the bandpass filter can be replaced by a shortpass filter, such as 1300 nm shortpass filter, so the system in effect becomes a bandpass filter of wavelength between 900 nm (detector cut off wavelength) to 1300 nm, centered at around 1150 nm.

Another method has been developed to identify defects within the DUT. Specifically, as noted above, signals at longer wavelengths, e.g., above 1850 nm suffer from high noise due to thermal emission. Therefore, traditionally artisans try to limit collection of light at these wavelengths. However, this embodiment takes advantage of this condition. Specifically, a test vector is applied to the DUT. Then an emission image is obtained without any filter in the optical path, or with a shortpass filter, e.g., a shortpass filter having cut-off at 1850 nm or 2000 nm. Then, while applying the same test signal, another image is taken, this time with a long pass filter, e.g., a filter that blocks any signal below 1850 nm or 2000 nm. That means that the second picture would include thermal emission and, therefore, in this disclosure is referred to as thermal image. Then the emission and thermal images are compared to identify differences.

Figure 7B:
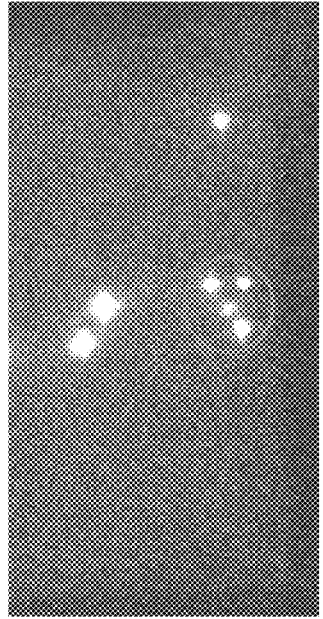
FIGS. 7A-7C illustrate an example of detecting defects by comparing an optical image and a thermal image.
Figure 7C:
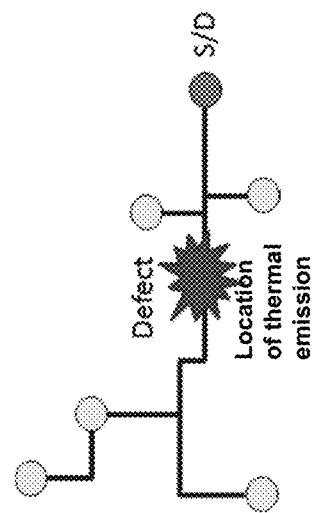
Figure 7A:
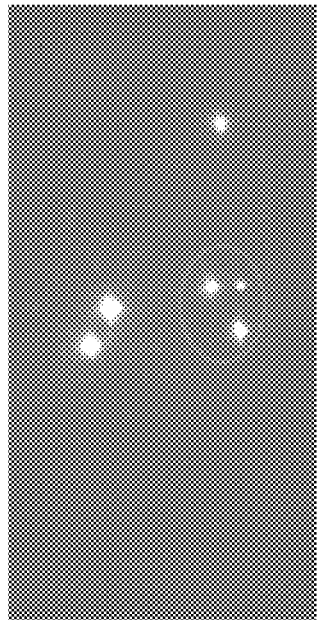

An example of the results of the method described above is shown in FIGS. 7A-7C. FIG. 7A is an emission image of an area of interest in the DUT. It shows six emission locations. These correspond to the nodes illustrated in the circuit of FIG. 7C. Conversely, in the thermal image shown in FIG. 7B an additional light appears. That light corresponds to a thermal emission resulting from a defect in the circuit, as illustrated in FIG. 7C.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method, comprising:
   imaging with an emission microscope a first photon emission originating from within a device under test (DUT) from an applied electrical signal and that is received by a detector situated in a thermal enclosure, wherein the first photon emission is filtered with an optical filter situated to block light above a defined cut-off wavelength;
   imaging a second photon emission originating from within the DUT form an applied electrical signal and that is received by the detector situated in the thermal enclosure, without the optical filter, to image light longer than the defined cut-off wavelength of the optical filter; and
   comparing the first imaging and the second imaging to identify a similarity of light intensity emitted from a common location of the DUT that is associated with an abnormal forward bias at the common location.

2. The method of claim 1, wherein the optical filter comprises a bandpass filter centered at 1150 nm, with a bandwidth of 300 nm.

3. The method of claim 1, wherein the optical filter comprises a shortpass filter having a cut-off selected from: 1300 nm, 1550 nm, 1800 nm, 1900 nm, and 2000 nm.

4. The method of claim 1, wherein the defined cut-off wavelength is 1550 nm.

5. The method of claim 1, wherein the imager has a low wavelength cut-on at 900 nm.

6. The method of claim 1, wherein at least one of the first imaging and second imaging includes imaging through a cold aperture.

7. The method of claim 6, wherein at least one of the first imaging and second imaging includes imaging through a relay lens.

8. The method of claim 1, wherein the first photon emission at the common location corresponds to an electron-hole recombination associated with a forward bias defect in a VLSI transistor.

9. A method for emission testing of a semiconductor device under test (DUT), comprising:
   applying electrical test signals to the DUT;
   collecting a first optical emission test signal from a thermally enclosed optical detector based on light that is emitted from the applied electrical test signals and filtered with a selected optical filter;
   collecting a second optical emission test signal from the optical detector based on light that is emitted from the applied electrical test signals and that is not filtered with the selected optical filter;
   comparing the first and second optical emission test signals to identify an abnormal forward bias in a circuit element in the DUT based on a similarity of light intensity emitted from a common location.

10. The method of claim 9, wherein the optical filter has a cutoff wavelength selected from 1550 nm, 1800 nm, 1900 nm and 2000 nm.

11. The method of claim 9, wherein collecting a first optical emission test signal includes imaging with light having a range of wavelengths selected to be between about 1200 nm and 2200 nm.

12. The method of claim 9, further comprising:
applying filter-selection electrical test signals to the DUT at a test voltage;
serially inserting each of a plurality of selectable optical filters into an optical path that couples the DUT to the optical detector and collecting a plurality of respective filter-selection optical emission test signals with the optical detector; and
based on the collected filter-selection optical emission test signals, selecting the selected optical filter from the plurality of selectable optical filters.

13. The method of claim 12, wherein selecting the selected optical filter includes generating a plot of signal-to-noise ratio versus wavelength for each of a plurality of different voltages corresponding to the test voltage.

14. The method of claim 12, further comprising keeping a temperature of the DUT constant.

15. The method of claim 12, further comprising keeping the test voltage constant.

16. The method of claim 12, wherein the selecting the selected optical filter includes selecting based on a highest signal-to-noise ratio associated with the plurality of selectable optical filters.

17. The method of claim 9, wherein the optical filter is a shortpass filter and the optical sensor operates as a longpass filter so that the first optical emission test signal is a bandpass filtered signal based on shortpass and longpass wavelength cutoffs provided by the shortpass filter and optical sensor, respectively.

18. A method for emission testing of a semiconductor device under test (DUT) with an emission microscope, comprising:
electrically stimulating the DUT with an electrical tester;
collecting thermal emissions originating from within said DUT that are directed through a longpass filter and received by a thermally enclosed optical detector to generate a thermal image;
collecting optical emissions originating from within said DUT without the longpass filter received by the thermally enclosed optical detector, to generate an emission image;
comparing the emission image to the thermal image; and
identifying a location in the thermal image having extra emission compared to the emission image, wherein the location corresponds to a hot carrier emission defect.

19. The method of claim 18, wherein collecting optical emissions comprises collecting light with wavelengths shorter than a defined cut-off wavelength of a shortpass filter situated in the optical path.

20. The method of claim 18, wherein the longpass filter has a cut-off wavelength selected from 1850 nm and 2000 nm.

21. The method of claim 18, wherein collecting the optical emissions includes directing the optical emissions through a bandwidth or a shortpass filter.

22. The method of claim 21, wherein a cut-off wavelength of the shortpass filter is 300 nm.

23. The method of claim 21, wherein a cut-off wavelength of the shortpass filter is selected from 1300 nm and 1550 nm.

* * * * *